US012485460B2

(12) United States Patent
Kirkby et al.

(10) Patent No.: US 12,485,460 B2
(45) Date of Patent: Dec. 2, 2025

(54) ACOUSTIC FOREIGN MATTER REMOVAL DEVICE

(71) Applicant: Yamaha Robotics Co., Ltd., Tokyo (JP)

(72) Inventors: Michael Kirkby, Tokyo (JP); Ysmaldo Jose Landaez Garcia, Tokyo (JP); Hiroshi Munakata, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 82 days.

(21) Appl. No.: 18/686,429

(22) PCT Filed: Aug. 26, 2021

(86) PCT No.: PCT/JP2021/031273
§ 371 (c)(1),
(2) Date: Feb. 25, 2024

(87) PCT Pub. No.: WO2023/026421
PCT Pub. Date: Mar. 2, 2023

(65) Prior Publication Data
US 2024/0390955 A1    Nov. 28, 2024

(51) Int. Cl.
*B06B 1/02*   (2006.01)
*B08B 7/00*   (2006.01)
*B08B 7/02*   (2006.01)
*H01L 21/02*  (2006.01)

(52) U.S. Cl.
CPC ............ *B08B 7/028* (2013.01); *B06B 1/0269* (2013.01); *B08B 7/00* (2013.01); *B06B 2201/70* (2013.01); *H01L 21/02076* (2013.01)

(58) Field of Classification Search
None
See application file for complete search history.

(56) References Cited

FOREIGN PATENT DOCUMENTS

| CN | 105834165 | 8/2016 |
|----|-----------|--------|
| CN | 111889342 | 11/2020 |
| JP | H07195046 | 8/1995 |
| JP | 2000117201 | 4/2000 |
| JP | 2012217876 | 11/2012 |

OTHER PUBLICATIONS

"Office Action of China Counterpart Application", with partial English translation thereof, issued on Mar. 12, 2025, pp. 1-13.
"Rejection Decision of China Counterpart Application", issued on Jun. 27, 2025, with English translation thereof, p. 1-p. 15.

(Continued)

*Primary Examiner* — Levon J Shahinian
(74) *Attorney, Agent, or Firm* — JCIPRNET

(57) ABSTRACT

An acoustic foreign matter removal device includes a stage, an acoustic head, and a movement mechanism. The acoustic head has a plurality of ultrasonic speakers and a casing 22. A plurality of ultrasonic waves generated from the plurality of ultrasonic speakers are concentrated in a gap between the casing and a holding surface of the stage to form a low pressure region; and foreign matter adhering to a surface of an electronic component is sucked into the low pressure region to remove the foreign matter from the surface.

9 Claims, 2 Drawing Sheets

(56) References Cited

OTHER PUBLICATIONS

Takayuki Hoshi, "Could Not Help Making Do-It-Yourself Acoustic Levitation Device (2nd Report)", Entertainment Computing Symposium (EC2015), Information Processing Society of Japan, Sep. 2015, pp. 100-106.
"International Search Report (Form PCT/ISA/210) of PCT/JP2021/031273", mailed on Oct. 5, 2021, with English translation thereof, pp. 1-4.
"Office Action of Taiwan Counterpart Application", issued on Apr. 25, 2022, with partial English translation thereof, pp. 1-10.

ACOUSTIC FOREIGN MATTER REMOVAL DEVICE

CROSS-REFERENCE TO RELATED APPLICATION

This application is a 371 application of the International PCT application serial no. PCT/JP2021/031273, filed on Aug. 26, 2021. The entirety of each of the above-mentioned patent applications is hereby incorporated by reference herein and made a part of this specification.

TECHNICAL FIELD

The present invention relates to a structure of an acoustic foreign matter removal device that removes foreign matter adhering to a surface of a target object using ultrasonic waves.

RELATED ART

There is a demand for the removal of foreign matter adhering to a surface of a semiconductor device such as image sensors. As a method for removing such foreign matter, a technique of removing foreign matter from a semiconductor device using liquid carbon dioxide ($CO_2$) is used. In this method, liquid carbon dioxide is sprayed on a surface of a target object from a spray nozzle, and dry ice particles frozen into dry ice due to adiabatic expansion during spraying collide with the target object to remove foreign matters on the surface (See Patent Literature 1, for example).

CITATION LIST

Patent Literature

[Patent Literature 1] JP 2000-117201

SUMMARY OF INVENTION

Technical Problem

However, the method described in Patent Literature 1 requires a mechanism for freezing high-purity dry ice, which makes the device large and complicated. Moreover, the semiconductor device may be damaged when the dry ice particles are blown.

Accordingly, an object of the present invention is to suppress damage to a target object and to remove foreign matter with a simple configuration.

Solution to Problem

An acoustic foreign matter removal device of the present invention is an acoustic foreign matter removal device for removing foreign matter adhering to a surface of a target object, including: a stage that holds the target object on a holding surface; and an acoustic head arranged to be separated apart from the stage. The acoustic head has a plurality of ultrasonic generators having directivity, and a casing to which the plurality of ultrasonic generators are mounted such that a plurality of ultrasonic waves generated from the plurality of ultrasonic generators are concentrated. The plurality of ultrasonic waves generated from the plurality of ultrasonic generators are concentrated in a gap between the casing and the holding surface of the stage to form a low pressure region having a pressure lower than atmospheric pressure in the gap; and the foreign matter adhering to a surface of the target object is sucked into the low pressure region to remove the foreign matter from the surface.

In this way, since the foreign matter adhering to the surface of the target object is sucked into the low pressure region formed in the acoustic head to remove the foreign matter, the foreign matter may be removed without contact to the surface of the target object, and damage to the target object can be suppressed. Moreover, a device for freezing dry ice as in the prior art disclosed in Patent Literature 1 is not required, and foreign matter adhering to the surface of the target object can be removed with a simple configuration.

In the acoustic foreign matter removal device of the present invention, the casing of the acoustic head may have a ring-shape or a dome shape with the stage side open, and the plurality of ultrasonic generators may be a plurality of ultrasonic speakers mounted on the casing such that respective axes are concentrated in the gap.

In this way, by arranging of the plurality of ultrasonic speakers such that the respective axes are concentrated in the gap between the casing and the holding surface of the stage, the pressure in the low pressure region may be made lower, and a greater suction force may be generated.

The acoustic foreign matter removal device of the present invention may include a drive circuit that drives the plurality of ultrasonic generators, and the drive circuit may adjust respective phases of the ultrasonic waves generated from respective ultrasonic generators. Further, the drive circuit may include a plurality of drive units that drive one of the ultrasonic generators, and the drive units may adjust the phase of the ultrasonic waves generated from the ultrasonic generators.

In this way, by adjusting respective phases of the ultrasonic waves of the plurality of ultrasonic generators in this way, the shape, size, and position of the low pressure region to be formed can be freely adjusted according to the foreign matter to be removed.

The acoustic foreign matter removal device of the present invention includes a movement mechanism that relatively moves the acoustic head with respect to the stage, and the movement mechanism may relatively move the acoustic head to a foreign matter disposal unit arranged to be separated apart from the target object.

As a result, the sucked foreign matter may be disposed of without adhering to the target object again.

In the acoustic foreign matter removal device of the present invention, the movement mechanism may relatively move the low pressure region where the acoustic head is formed along the surface of the target object held on the stage so as to be separated apart from the surface by a quarter wavelength to a half wavelength of the ultrasonic waves.

Due to the ultrasonic waves reflected by the surface of the target object, the low pressure region is located a quarter wavelength to a half wavelength of the ultrasonic waves above the surface of the target object. For this reason, by moving the low pressure region by a movement mechanism so as to be separated apart from the surface of the target object by a quarter wavelength to a half wavelength of the ultrasonic wave, the low pressure region is brought closer to the surface to effectively suck the foreign matter into the low pressure region.

Effects

This invention can remove a foreign matter with a simple structure while suppressing damage to a target object.

DESCRIPTION OF EMBODIMENTS

Figure 1:
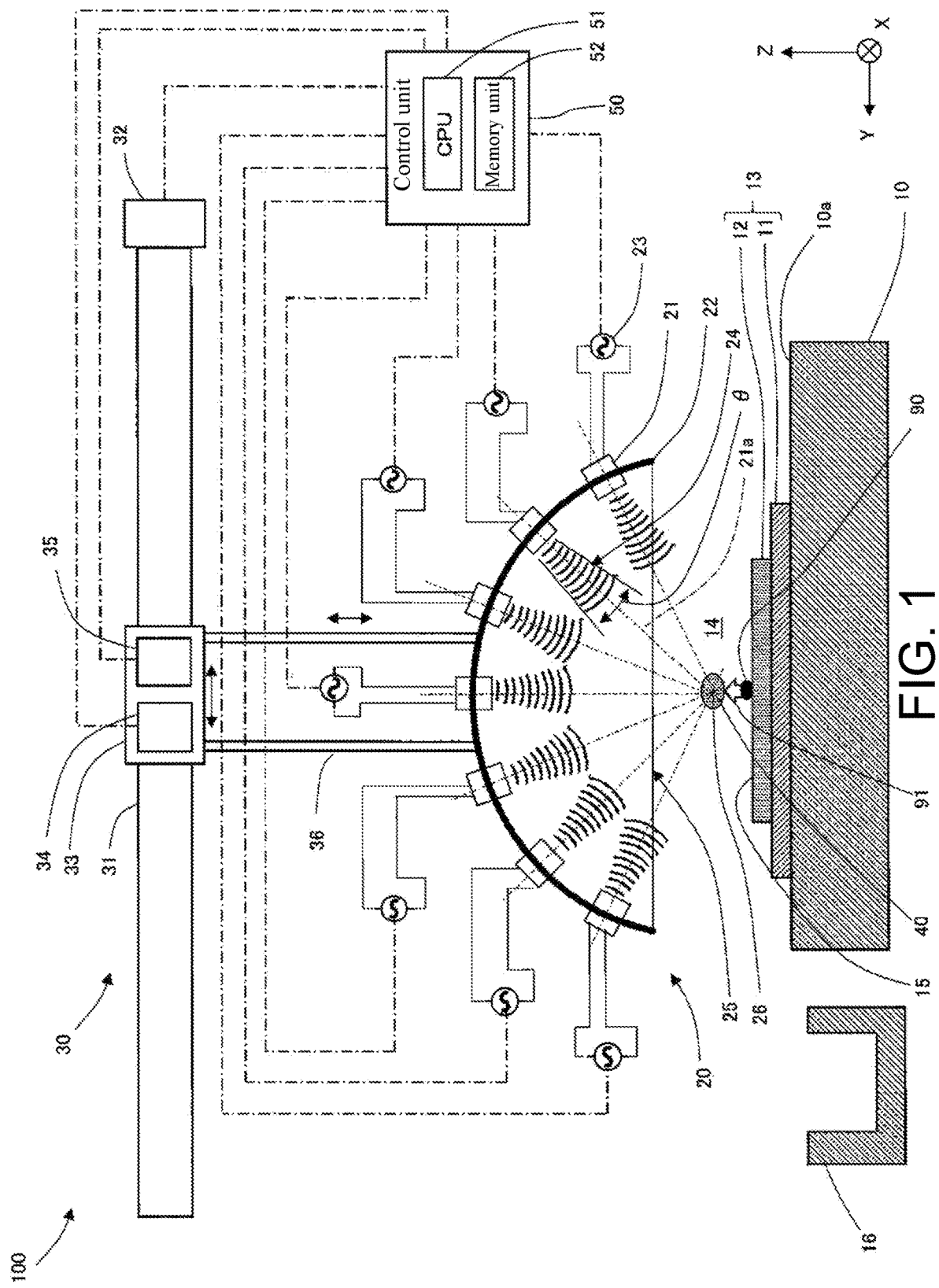
FIG. 1 is an elevational view showing the configuration of an acoustic foreign matter removal device according to an embodiment.

An acoustic foreign matter removal device 100 according to an embodiment will be described below with reference to the drawings. As shown in FIG. 1, the acoustic foreign matter removal device 100 includes a stage 10, an acoustic head 20, a movement mechanism 30, and a foreign matter disposal unit 16. In the following description, the direction perpendicular to the paper surface of FIG. 1 is defined as the X direction, the horizontal direction perpendicular to the X direction is defined as the Y direction, and the vertical direction is defined as the Z direction.

The stage 10 is mounted on a base (not shown). The stage 10 sucks and holds an electronic component 13, which is a target object, on an upper holding surface 10a. The electronic component 13 may be, for example, an image sensor 12 mounted on a substrate 11. The stage 10 may transport the electronic component 13 in the X direction. Moreover, the foreign matter disposal unit 16 is arranged beside the stage 10. The foreign matter disposal unit 16 includes, for example, a downward vacuum suction mechanism.

The acoustic head 20 is arranged above the stage 10, separated apart from the stage 10. The acoustic head 20 is composed of a casing 22, and a plurality of ultrasonic speakers 21 mounted on the casing 22. The casing 22 of the acoustic head 20 is connected to the movement mechanism 30 that moves the acoustic head 20 relative to the electronic component 13 sucked and held on the holding surface 10a of the stage 10.

The movement mechanism 30 includes a guide rail 31 mounted on a base (not shown) so as to be movable in the X direction, and a slider 33 that moves along the guide rail 31 in the Y direction. The guide rail 31 is configured to be movable in the X direction by an X-direction movement mechanism 32. The slider 33 includes a Y-direction movement mechanism 34 inside and is configured to be guided by the guide rail 31 and movable in the Y direction. The casing 22 of the acoustic head 20 is connected to the slider 33 by an arm 36 extending in the Z direction. The slider 33 is internally provided with a Z-direction movement mechanism 35 that drives the arm 36 in the Z direction, and is configured to move the acoustic head 20 in the Z direction. Thus, the movement mechanism 30 is configured to be able to move the acoustic head 20 relative to the electronic component 13 sucked and held on the stage 10 in the X, Y, and Z directions. Further, the movement mechanism 30 is configured to be able to move the acoustic head 20 to above the foreign matter disposal unit 16.

The casing 22 of the acoustic head 20 has a spherical dome shape and is open on the lower stage side. A spherical center 26 of a spherical surface that constitutes the casing 22 is positioned in a gap 14 between the casing 22 and the holding surface 10a of the stage 10 in a central lower portion of the casing 22 below a lower open surface 25. The ultrasonic speakers 21 are ultrasonic generators having directivity, and generate ultrasonic waves 24 such that the ultrasonic waves 24 propagate in the direction of axes 21a in the range of a directivity angle θ centered on the axis 21a. The plurality of ultrasonic speakers 21 are mounted on the casing 22 such that respective axes 21a intersect at the spherical center 26 of the spherical surface of the casing 22. Thus, the ultrasonic waves 24 generated from the plurality of ultrasonic speakers 21 intersect at the central lower portion of the casing 22 where the spherical center 26 is positioned. Since the spherical center 26 is positioned in the gap 14 between the holding surface 10a of the stage 10, the ultrasonic waves 24 are concentrated in the gap 14.

Each of the ultrasonic speakers 21 is connected with a drive unit 23 for driving the ultrasonic speaker 21. Each of the drive units 23 may adjust the phase of the ultrasonic wave 24 generated by the connected ultrasonic speaker 21. Moreover, the plurality of drive units 23 constitute a drive circuit that drives an ultrasonic speaker group composed of the plurality of ultrasonic speakers 21.

The X-direction movement mechanism 32, the Y-direction movement mechanism 34, and the Z-direction movement mechanism 35 of the movement mechanism 30, and the drive unit 23 that drives each of the ultrasonic speakers 21 are connected to a control unit 50 and driven by commands from the control unit 50. The control unit 50 is a computer that includes a CPU 51, which is a processor that processes information inside, and a memory unit 52 that stores control programs and control data.

The operation of the acoustic foreign matter removal device 100 configured as above will be described. The control unit 50 drives each of the ultrasonic speakers 21 by each of the drive units 23 to generate the ultrasonic wave 24 of a predetermined frequency from each of the ultrasonic speakers. Each of the ultrasonic speakers 21 has directivity, and propagates in the direction of each of the axes 21a in the range of the directivity angle θ centered on the axis 21a. Each of the ultrasonic speakers 21 is mounted on the casing 22 such that the respective axes 21a intersect at the center of the spherical center 26 positioned in the central lower portion of the casing 22, the ultrasonic waves 24 generated from the respective ultrasonic speakers 21 intersect at the central lower portion of the casing 22 or at the gap 14 and are concentrated and overlapped. Due to the overlap of the ultrasonic waves 24, a low pressure region 40 having a pressure lower than the atmospheric pressure is formed in the central lower portion of the casing 22. The low pressure region 40 is about a half wavelength of the ultrasonic waves 24 in diameter.

The control unit 50 is moved by the movement mechanism 30 such that the low pressure region 40 is above the image sensor 12, for example, several millimeters above, and in a manner of scanning in the X and Y directions. It may also be moved by the movement mechanism 30 such that the low pressure region 40 is separated apart from a surface 15 of the image sensor 12 by a quarter wavelength to a half wavelength of the ultrasonic waves 24 and in a manner of scanning the acoustic head 20 in the X and Y directions, since due to the ultrasonic waves 24 reflected by the surface 15 of the image sensor 12, the low pressure region 40 is located a quarter wavelength to a half wavelength of the ultrasonic waves 24 above the surface 15 of the image sensor 12. When the frequency of the ultrasonic waves 24 is 40 kHz, a half wavelength is 4.25 mm and a quarter wavelength is 2.125 mm, thus the acoustic head 20 is moved such that the low pressure region 40 is above the surface 15 of the image sensor 12 by about 1 to 5 mm.

As a result, the low pressure region 40 formed in the central lower portion of the casing 22 moves in the X and Y directions along the surface 15 above the surface 15 of the image sensor 12 held on the stage 10. Further, the ultrasonic waves 24 generated from the respective ultrasonic speakers 21 hit the surface 15 of the image sensor 12. Moreover, when the low pressure region 40 comes over a foreign matter 90 adhering to the surface 15 of the image sensor 12, the foreign matter 90 is separated apart from the surface 15 of the image sensor 12 by vibration caused by the ultrasonic waves 24. The foreign matter 90 is then sucked into the nearby low pressure region 40 and removed from the surface 15 of the image sensor 12, as indicated by an outline arrow 91 in FIG. 1. The sucked foreign matter 90 is caught in the low pressure region 40 and moves together with the acoustic head 20 in a floating state.

After scanning the acoustic head 20 above the image sensor 12 in the X and Y directions, the control unit 50 moves the acoustic head 20 above the foreign matter disposal unit 16. The foreign matter disposal unit 16 includes, for example, a downward vacuum suction mechanism. When the acoustic head 20 comes above the foreign matter disposal unit 16, the control unit 50 stops driving the ultrasonic speakers 21 by the drive units 23. As a result, the low pressure region 40 disappears, and the foreign matter 90 caught in the low pressure region 40 is vacuum-sucked into the lower foreign matter disposal unit 16 and disposed of to the outside. As a result, the foreign matter 90 sucked by the low pressure region 40 may be disposed of without adhering to the image sensor 12 again.

As explained above, the acoustic foreign matter removal device 100 removes the foreign matter 90 by sucking the foreign matter 90 adhering to the surface 15 of the electronic component 13 in the low pressure region 40 formed by the acoustic head 20, the foreign matter 90 may be removed without contacting the surface 15 of the electronic component 13, and damage to the electronic component 13 can be suppressed. Moreover, a device for freezing dry ice, such as the prior art described in Patent Literature 1, is not required, and the foreign matter 90 adhering to the surface 15 of the electronic component 13 can be removed with a simple configuration.

Moreover, respective drive units 23 of the acoustic foreign matter removal device 100 may adjust the phase of the ultrasonic waves 24 generated by the connected ultrasonic speakers 21, and by adjusting respective phases, may adjust the shape, size, and position of the low pressure region 40 to be formed according to the foreign matter 90 to be removed.

Further, in the acoustic foreign matter removal device 100, the casing 22 has a spherical dome shape, and the respective ultrasonic speakers 21 are mounted such that the respective axes 21a intersect at the spherical center 26. By overlapping the ultrasonic waves 24 at one point in this way, the low pressure region 40 with a lower pressure may be stably formed. Thus, the position of the low pressure region 40 does not shake, and the foreign matter 90 may be reliably sucked.

However, the shape of the casing 22 is not limited to such a spherical shape. For example, the casing 22 may have an oval dome shape. Moreover, even if the respective axes 21a do not intersect at the central lower portion of the casing 22, it suffices that the respective ultrasonic speakers 21 are mounted on the casing 22 in such a way that the respective axes 21a are concentrated in the central lower portion and the ultrasonic waves 24 generated by the ultrasonic speakers 21 are concentrated at the central lower portion of the casing 22, for example, as long as the ranges of respective directivity angles θ centered on the respective axes 21a of the respective ultrasonic speakers 21 intersect.

Further, the drive unit 23 that drives the ultrasonic speaker 21 has been described as being connected to each of the ultrasonic speakers 21, but the present invention is not limited thereto, and several ultrasonic speakers 21 may be configured to be driven by one drive unit 23.

Moreover, the movement mechanism 30 has been described as being composed of the guide rail 31 that moves in the X direction, the slider 33 that moves in the Y direction, and the Z-direction movement mechanism 35 mounted on the slider 33, but it is not limited thereto. For example, the acoustic head 20 may be mounted on the tip of a robot arm that is freely movable in the X, Y, and Z directions. In this case, the robot arm constitutes the movement mechanism 30. Further, the stage 10 may be configured to move in the X, Y, and Z directions, or the electronic component 13 placed on the stage 10 may be configured to move in the X and Y directions.

Figure 2:
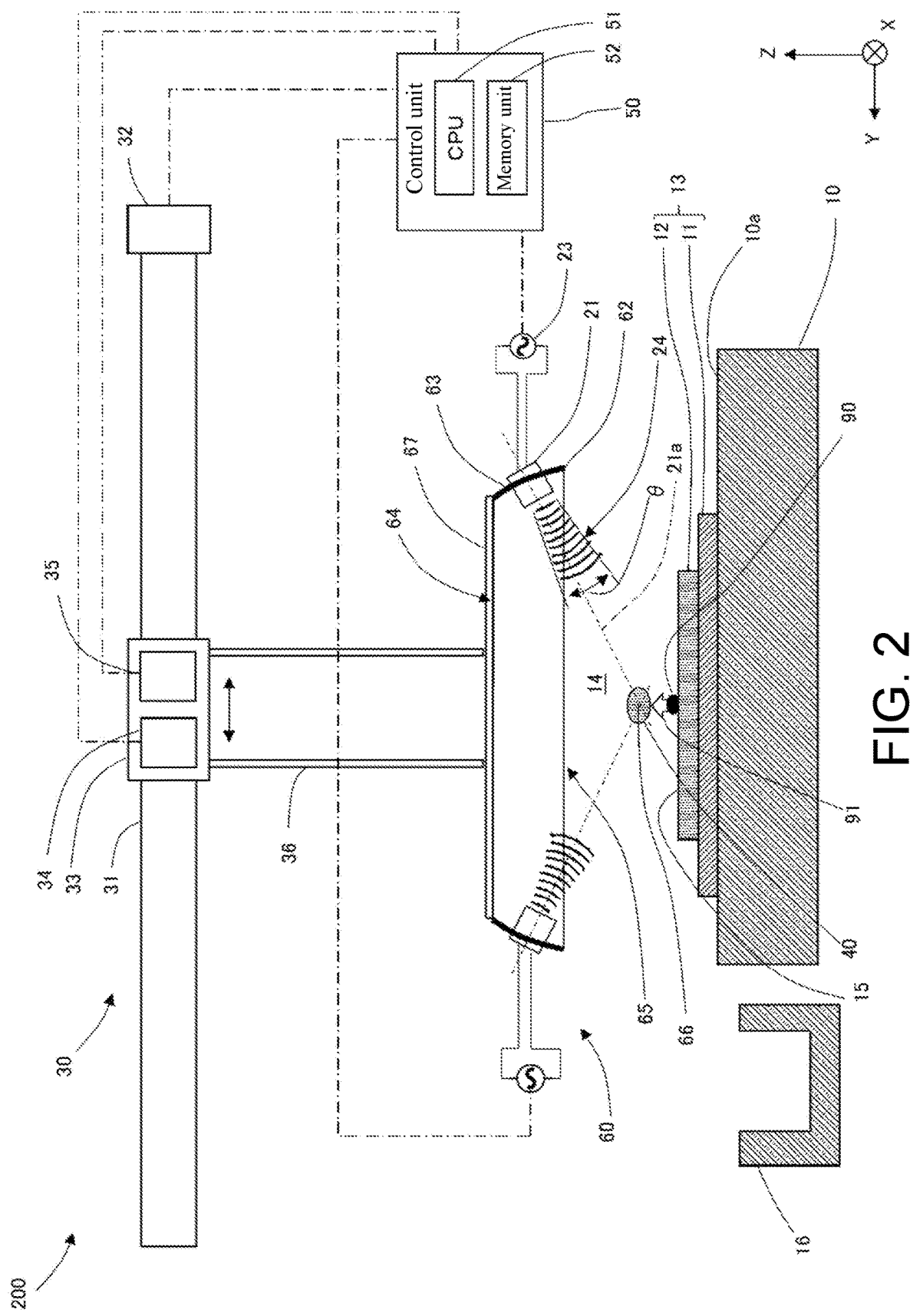
FIG. 2 is an elevational view showing the configuration of an acoustic foreign matter removal device according to another embodiment.

Next, an acoustic foreign matter removal device 200 of another embodiment will be described with reference to FIG. 2. Parts similar to those of the acoustic foreign matter removal device 100 described above with reference to FIG. 1 are denoted by the same reference numerals, and the description thereof is omitted. As shown in FIG. 2, an acoustic head 60 of the acoustic foreign matter removal device 200 has the plurality of ultrasonic speakers 21 mounted to a ring-shaped casing 62.

As shown in FIG. 2, the casing 62 is an annular member of a spherical segment shape having a small-diameter upper open surface 64 and a large-diameter lower open surface 65, and the plurality of ultrasonic speakers 21 are mounted on a spherical zone surface 63. A spherical center 66 of the spherical zone surface 63 is positioned in the gap 14 between the acoustic head 60 and the holding surface 10a of the stage 10 at the central lower portion of the casing 62 below the lower open surface 65. The plurality of ultrasonic speakers 21 are mounted on the casing 62 such that the respective axes 21a intersect at the spherical center 66 of the spherical surface of the casing 62. Similar to the acoustic foreign matter removal device 100 described above with reference to FIG. 1, the ultrasonic waves 24 generated from the respective ultrasonic speakers 21 intersect at the central lower portion of the casing 22 and are concentrated and overlapped. Due to the overlap of the ultrasonic waves 24, the low pressure region 40 having a pressure lower than the atmospheric pressure is formed in the central lower portion of the casing 22.

A stay 67 is mounted on the upper open surface 64 of the casing 62, and the arm 36 is connected to the stay 67. Similar to the acoustic head 20 of the acoustic foreign matter removal device 100 described above with reference to FIG. 1, the acoustic head 60 may be relatively moved in X, Y, and Z directions with respect to the electronic component 13 sucked and held on the stage 10 by the movement mechanism 30.

The operation of the acoustic foreign matter removal device 200 is similar to that of the acoustic foreign matter removal device 100 described above with reference to FIG. 1, such that the foreign matter 90 may be removed while suppressing the damage to the electronic component 13.

Since the casing 62 of the acoustic foreign matter removal device 200 is made of annular member of a spherical segment shape, its thickness in the Z direction may be reduced, and it may be incorporated into a compact bonding device or the like.

In the above description, the casing 62 of the acoustic head 60 has been described as an annular member of a spherical segment shape having the small-diameter 64 and the large-diameter lower open surface 65, it is not limited thereto, and a lid may be mounted on the upper open surface 64. In this case, the ultrasonic waves 24 generated from the ultrasonic speakers 21 are less likely to be affected by outside air, so the position and size of the low pressure region 40 can be more stabilized. Moreover, the ultrasonic speakers 21 may be mounted on the lid. As a result, the pressure in the low pressure region 40 may be further lowered to suck large foreign matter 90.

What is claimed is:

1. An acoustic foreign matter removal device for removing foreign matter adhering to a surface of a target object, the acoustic foreign matter removal device comprising:
    a stage that holds the target object on a holding surface;
    an acoustic head arranged to be separated apart from the stage; and
    a movement mechanism that relatively moves the acoustic head with respect to the stage,
    wherein the acoustic head has a plurality of ultrasonic generators having directivity, and a casing to which the plurality of ultrasonic generators are mounted such that a plurality of ultrasonic waves generated from the plurality of ultrasonic generators are concentrated
    the plurality of ultrasonic waves generated from the plurality of ultrasonic generators are concentrated in a gap between the casing and the holding surface of the stage to form a low pressure region having a pressure lower than atmospheric pressure in the gap; and the foreign matter adhering to the surface of the target object is sucked into the low pressure region to remove the foreign matter from the surface, and
    the movement mechanism relatively moves the acoustic head to a foreign matter disposal unit arranged to be separated apart from the target object.

2. The acoustic foreign matter removal device according to claim 1,
    wherein the casing of the acoustic head has a ring shape or a dome shape with the stage side open, and
    the plurality of ultrasonic generators are a plurality of ultrasonic speakers mounted on the casing such that respective axes are concentrated in the gap.

3. The acoustic foreign matter removal device according to claim 2, comprising:
    a drive circuit that drives the plurality of ultrasonic generators,
    wherein the drive circuit is capable of adjusting respective phases of the ultrasonic waves generated from respective ultrasonic generators.

4. The acoustic foreign matter removal device according to claim 2,
    wherein the movement mechanism relatively moves the low pressure region where the acoustic head is formed along the surface of the target object held on the stage so as to be separated apart from the surface by a quarter wavelength to a half wavelength of the ultrasonic waves.

5. The acoustic foreign matter removal device according to claim 1, comprising:
    a drive circuit that drives the plurality of ultrasonic generators,
    wherein the drive circuit is capable of adjusting respective phases of the ultrasonic waves generated from respective ultrasonic generators.

6. The acoustic foreign matter removal device according to claim 5,
    wherein the drive circuit includes a plurality of drive units that drive one of the ultrasonic generators, and
    the drive unit is capable of adjusting the phase of the ultrasonic waves generated from the ultrasonic generators.

7. The acoustic foreign matter removal device according to claim 6,
    wherein the movement mechanism relatively moves the low pressure region where the acoustic head is formed along the surface of the target object held on the stage so as to be separated apart from the surface by a quarter wavelength to a half wavelength of the ultrasonic waves.

8. The acoustic foreign matter removal device according to claim 5,
    wherein the movement mechanism relatively moves the low pressure region where the acoustic head is formed along the surface of the target object held on the stage so as to be separated apart from the surface by a quarter wavelength to a half wavelength of the ultrasonic waves.

9. The acoustic foreign matter removal device according to claim 1,
    wherein the movement mechanism relatively moves the low pressure region where the acoustic head is formed along the surface of the target object held on the stage so as to be separated apart from the surface by a quarter wavelength to a half wavelength of the ultrasonic waves.

* * * * *